United States Patent
Hashimoto et al.

(10) Patent No.: US 9,570,461 B2
(45) Date of Patent: Feb. 14, 2017

(54) METHOD FOR MANUFACTURING SEMICONDUCTOR MEMORY DEVICE

(71) Applicant: Kabushiki Kaisha Toshiba, Minato-ku (JP)

(72) Inventors: Junichi Hashimoto, Yokkaichi (JP); Katsunori Yahashi, Yokkaichi (JP); Daigo Ichinose, Nagoya (JP); Tadashi Iguchi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 21 days.

(21) Appl. No.: 14/731,910

(22) Filed: Jun. 5, 2015

(65) Prior Publication Data
US 2015/0372007 A1    Dec. 24, 2015

(30) Foreign Application Priority Data
Jun. 24, 2014    (JP) ................... 2014-128830

(51) Int. Cl.
*H01L 21/336*    (2006.01)
*H01L 27/115*    (2006.01)
*H01L 21/311*    (2006.01)

(52) U.S. Cl.
CPC ..... *H01L 27/11582* (2013.01); *H01L 27/1157* (2013.01); *H01L 27/11565* (2013.01); *H01L 21/31144* (2013.01)

(58) Field of Classification Search
CPC .............. H01L 27/11582; H01L 27/1157
USPC .................................................. 438/268
See application file for complete search history.

(56) References Cited

U.S. PATENT DOCUMENTS

| | | | |
|---|---|---|---|
| 5,550,773 A | 8/1996 | Woerlee et al. | |
| 7,649,763 B2 | 1/2010 | Takashima | |
| 2006/0044429 A1* | 3/2006 | Toda | G01J 3/04 348/272 |
| 2013/0028379 A1* | 1/2013 | Nelson | G01N 23/04 378/62 |
| 2013/0112891 A1* | 5/2013 | Kato | H01J 37/045 250/396 R |

FOREIGN PATENT DOCUMENTS

JP    2012-069686    4/2012

* cited by examiner

*Primary Examiner* — Jami M Valentine
(74) *Attorney, Agent, or Firm* — Oblon, McClelland, Maier & Neustadt, L.L.P.

(57) ABSTRACT

According to one embodiment, a method for manufacturing a semiconductor memory device includes forming a stacked body including a plurality of first layers and a plurality of second layers on a substrate. The method includes forming a first slit and a second slit simultaneously by dry-etching the stacked body. The first slit causes a part of the stacked body to have a comb-shaped pattern including a plurality of line parts isolated in a first direction and extending in a second direction. The second slit surrounds the comb-shaped pattern with a closed pattern. The method includes forming a hole in the line parts of the stacked body. The method includes forming a charge storage film and a semiconductor body in the hole.

16 Claims, 14 Drawing Sheets

METHOD FOR MANUFACTURING SEMICONDUCTOR MEMORY DEVICE

CROSS-REFERENCE TO RELATED APPLICATION

This application is based upon and claims the benefit of priority from Japanese Patent Application No. 2014-128830, filed on Jun. 24, 2014; the entire contents of which are incorporated herein by reference.

FIELD

Embodiments described herein relate generally to a method for manufacturing a semiconductor memory device.

BACKGROUND

A memory device having a three-dimensional structure is proposed. In the memory device, a memory hole is formed in a stacked body including a plurality of electrode layers stacked via an insulating layer. The electrode layers function as a control gate in a memory cell. A silicon body as a channel is provided on a side wall of the memory hole via a charge storage film.

In the three-dimensional device as stated above, a slit and the memory hole are formed by, for example, an Reactive Ion Etching (RIE) method in the stacked body including the electrode layers and the insulating layers. The etching is required to have high shape controllability.

BRIEF DESCRIPTION OF THE DRAWINGS

FIG. 11A to FIG. 12B are schematic sectional views showing a method for manufacturing the semiconductor memory device of the embodiment;

DETAILED DESCRIPTION

According to one embodiment, a method for manufacturing a semiconductor memory device includes forming a stacked body including a plurality of first layers and a plurality of second layers by alternately stacking the first layers and the second layers on a substrate. The method includes forming a first slit and a second slit simultaneously by dry-etching the stacked body using a mask layer. The first slit causes a part of the stacked body to have a comb-shaped pattern including a plurality of line parts isolated in a first direction and extending in a second direction intersecting the first direction. The second slit surrounds the comb-shaped pattern with a closed pattern. The method includes forming a hole in the line parts of the stacked body. The method includes forming a charge storage film and a semiconductor body in the hole.

Hereinafter, an embodiment will be described with reference to the drawings. Incidentally, the same components in the respective drawings are denoted by the same reference characters.

Figure 1:
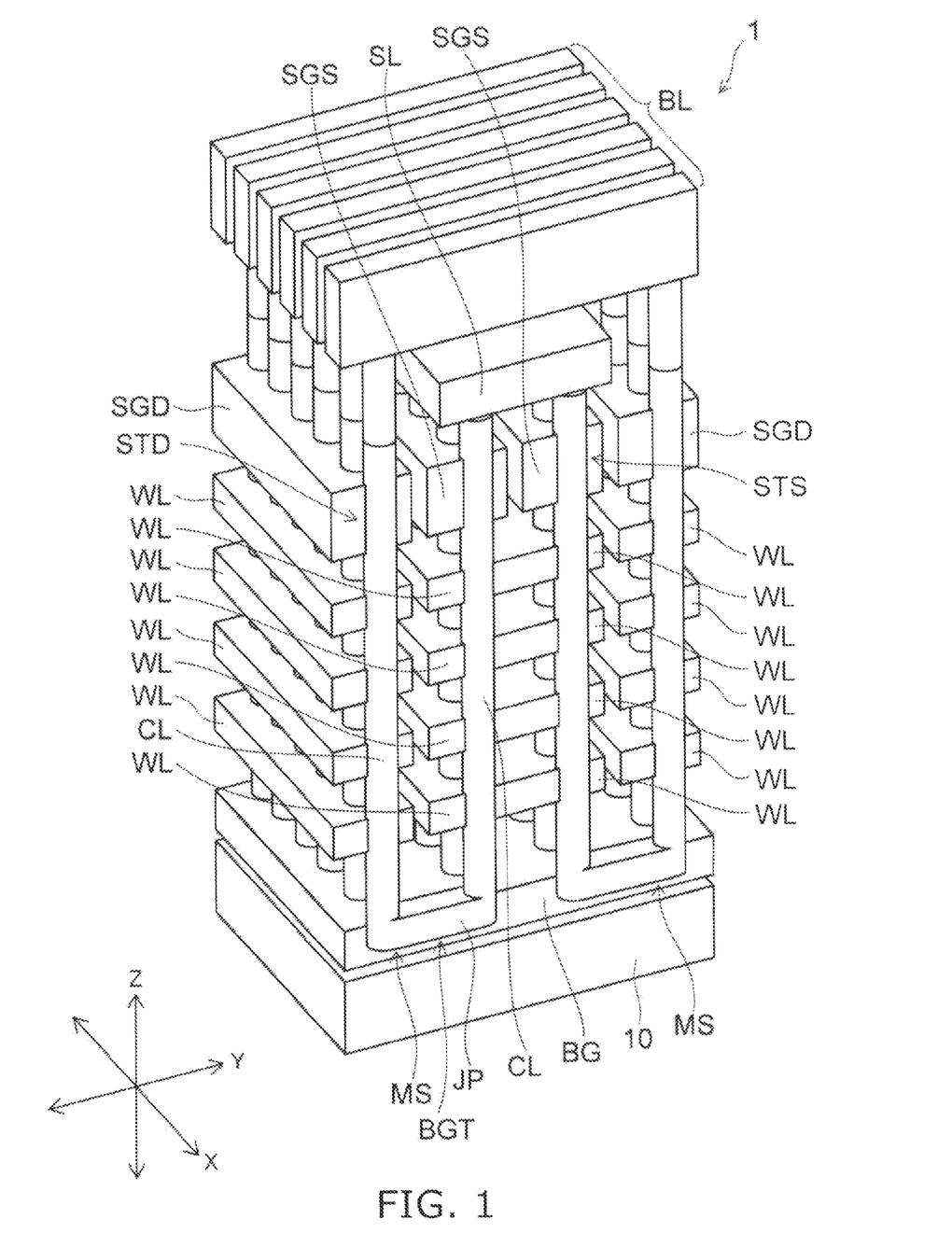
FIG. 1 is a schematic perspective view of a memory cell array of an embodiment.

FIG. 1 is a schematic perspective view of a memory cell array 1. Incidentally, in FIG. 1, for making the drawing easy to see, illustrations of inter-electrode insulating layers, insulating isolation films and the like are omitted.

In FIG. 1, two directions orthogonal to each other are an X-direction and a Y-direction, and a direction which is orthogonal to the X-direction and the Y-direction (XY plane) and in which plural electrode layers WL are stacked is a Z-direction (stacking direction).

Figure 2:
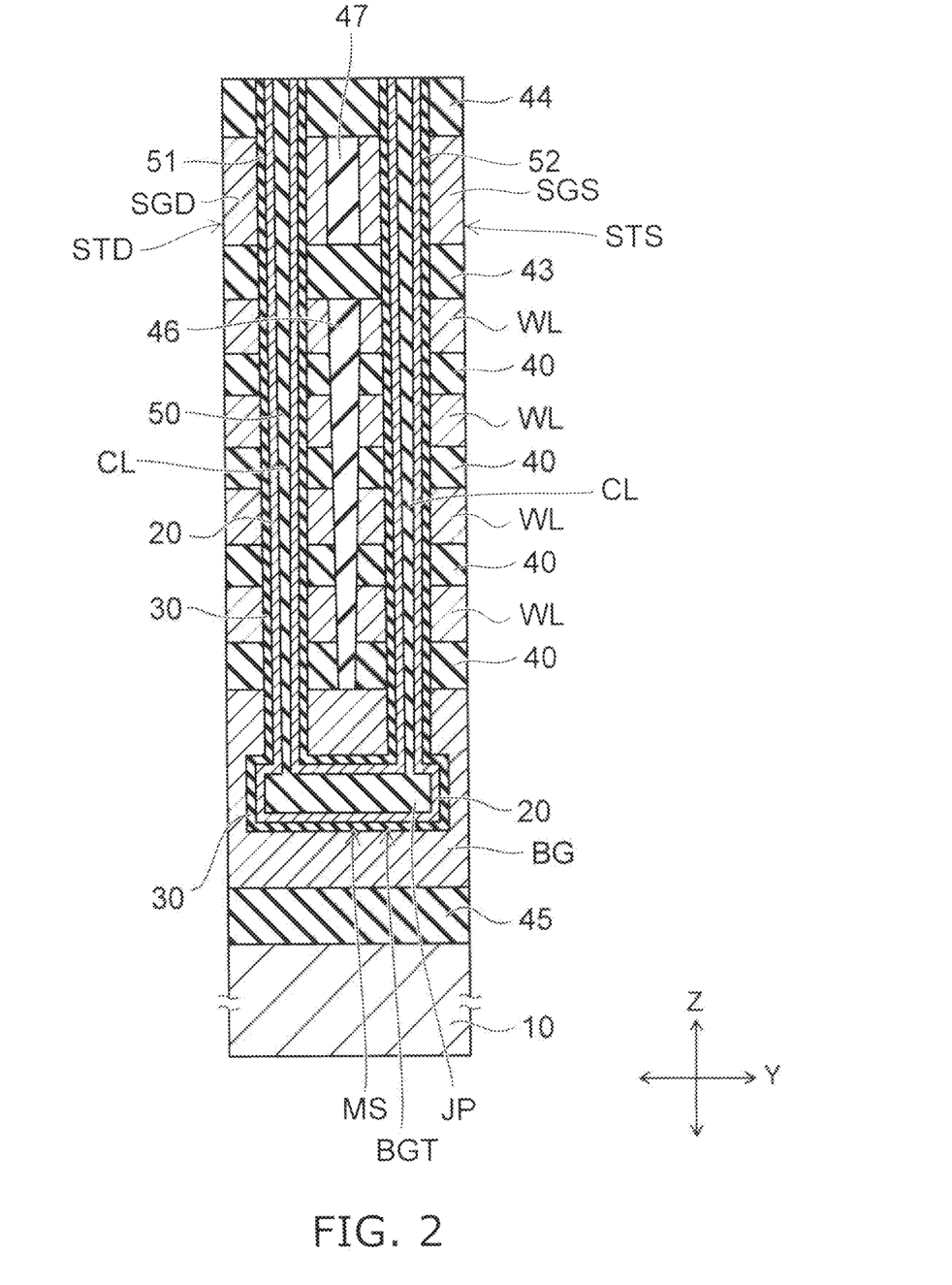
FIG. 2 is a schematic sectional view of a memory string of the embodiment.

The memory cell array 1 includes plural memory strings MS. FIG. 2 is a schematic sectional view of the memory string MS. FIG. 2 shows a section parallel to a YZ plane in FIG. 1.

The memory cell array 1 includes a stacked body including the plural electrode layers WL and plural insulating layers 40. The electrode layers WL and the insulating layers 40 are alternately stacked. The insulating layer 40 is provided between the electrode layers WL. The stacked body is provided on a back gate BG as a lower gate layer. Incidentally, the layer number of the electrode layers WL shown in the drawing is merely an example, and the layer number of the electrode layers WL is arbitrary. The back gate BG is provided on a substrate 10 through an insulating layer 45.

The back gate BG and the electrode layer WL are layers mainly containing silicon. Further, the back gate BG and the electrode layer WL contain, for example, boron as an impurity for imparting conductivity to the silicon layer. Besides, the electrode layer WL may include metal silicide. Alternatively, the electrode layer WL is a metal layer. The insulating layer 40 mainly contains, for example, silicon oxide.

Each of the memory strings MS is formed into a U-shape including a pair of columnar parts CL extending in the Z-direction and a connecting part JP for joining respective lower end parts of the pair of columnar parts CL. The columnar part CL is formed into, for example, a cylindrical shape or an elliptic cylindrical shape, passes through the stacked body and reaches the back gate BG.

A drain side select gate SGD is provided on an upper end part of one of the pair of columnar parts CL in the U-shaped memory string MS, and a source side select gate SGS is provided on an upper end part of the other. The drain side select gate SGD and the source side select gate SGS are provided on the electrode layer WL of the uppermost layer through an inter-layer insulating layer 43.

The drain side select gate SGD and the source side select gate SGS are layers mainly containing silicon. Further, the drain side select gate SGD and the source side select gate SGS contain, for example, boron as an impurity for imparting conductivity to the silicon layer.

The drain side select gate SGD and the source side select gate SGS, which are upper select gates, and the back gate BG which is a lower select gate are thicker than the electrode layer WL of one layer.

The drain side select gate SGD and the source side select gate SGS are isolated in the Y-direction by an insulating isolation film 47. The stacked body below the drain side select gate SGD and the stacked body below the source side select gate SGS are isolated in the Y-direction by an insulating isolation film 46. That is, the stacked body between the pair of columnar parts CL of the memory string MS is divided in the Y-direction by the insulating isolation films 46 and 47.

A source line (for example, a metal film) SL shown in FIG. 1 is provided on the source side select gate SGS through an insulating layer 44. Plural bit lines (for example, metal films) BL shown in FIG. 1 are provided on the drain side select gate SGD and the source line SL through the insulating layer 44. Each of the bit lines BL extends in the Y-direction.

Figure 3:
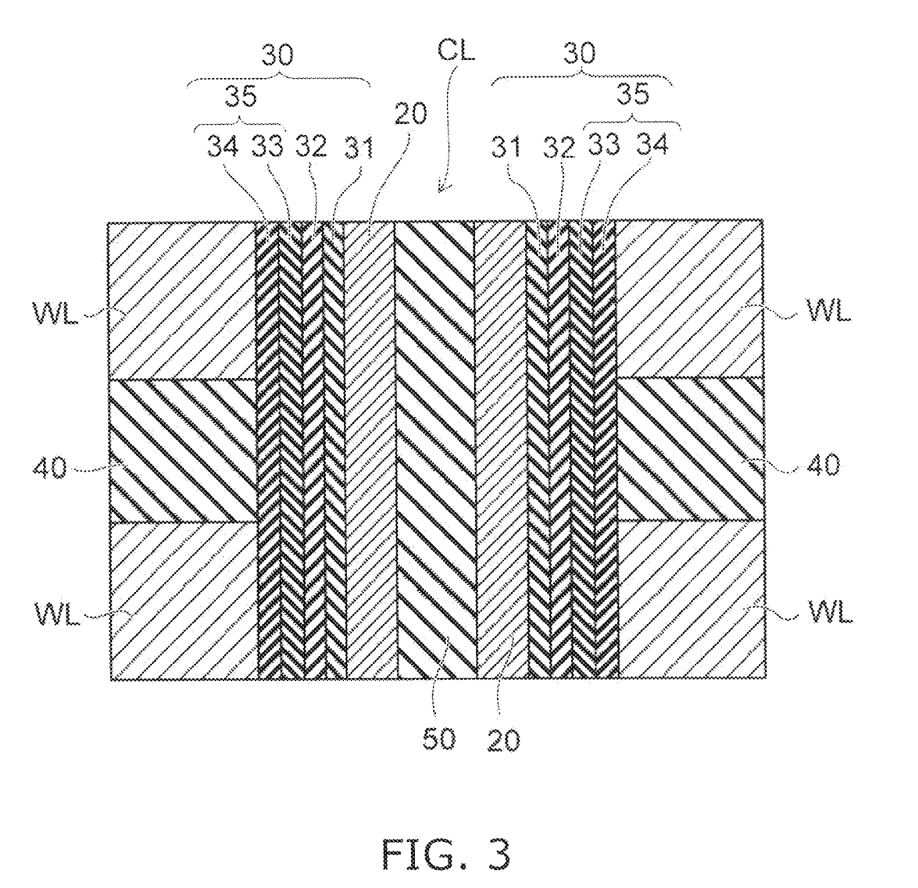
FIG. 3 is a schematic sectional view of a memory cell of the embodiment.

FIG. 3 is an enlarged schematic sectional view of a part of the columnar part CL.

The columnar part CL is formed in a U-shaped memory hole which is formed in the stacked body including the electrode layers WL of the plural layers, the insulating layers 40 of the plural layers and the back gate BG. A channel body 20 as a semiconductor body is provided in the memory hole. The channel body 20 is, for example, a silicon film. The impurity concentration of the channel body 20 is lower than the impurity concentration of the electrode layer WL.

A memory film 30 is provided between an inner wall of the memory hole and the channel body 20. The memory film 30 includes a block insulating film 35, a charge storage film 32 and a tunnel insulating film 31.

The block insulating film 35, the charge storage film 32 and the tunnel insulating film 31 are provided between the electrode layer WL and the channel body 20 sequentially from the electrode layer WL side.

The channel body 20 is provided into a tubular shape extending in the stacking direction of the stacked body, and the memory film 30 is provided into a tubular shape while extending in the stacking direction of the stacked body so as to surround the outer peripheral surface of the channel body 20. The electrode layer WL surrounds the periphery of the channel body 20 through the memory film 30. A core insulating film 50 is provided inside the channel body 20. The core insulating film 50 is, for example, a silicon oxide film.

The block insulating film 35 contacts the electrode layer WL, and the tunnel insulating film 31 contacts the channel body 20. The charge storage film 32 is provided between the block insulating film 35 and the tunnel insulating film 31.

The channel body 20 functions as a channel in a memory cell, and the electrode layer WL functions as a control gate of the memory cell. The charge storage film 32 functions as a data memory layer for storing charge injected from the channel body 20. That is, the memory cell having a configuration in which the control gate surrounds the channel is formed in an intersection portion between the channel body 20 and each of the electrode layers WL.

The semiconductor memory device of the embodiment is a nonvolatile semiconductor memory device in which erasing and writing of data can be electrically freely performed, and even if power is turned off, the storage content can be held.

The memory cell is, for example, a charge-trap type memory cell. The charge storage film 32 includes many trap sites for capturing charges, and is, for example, a silicon nitride film.

The tunnel insulating film 31 becomes a potential barrier when charge is injected from the channel body 20 into the charge storage film 32 or when charge stored in the charge storage film 32 diffuses into the channel body 20. The tunnel insulating film 31 is, for example, a silicon oxide film.

Alternatively, a stacked film (ONO film) having a configuration in which a silicon nitride film is sandwiched between a pair of silicon oxide films may be used as the tunnel insulating film. When the ONO film is used as the tunnel insulating film, an erasing operation can be performed at a low electric field as compared with the single layer of the silicon oxide film.

The block insulating film 35 prevents the charge stored in the charge storage film 32 from diffusing into the electrode layer WL. The block insulating film 35 includes a cap film 34 provided to contact the electrode layer WL and a block film 33 provided between the cap film 34 and the charge storage film 32.

The block film 33 is, for example, a silicon oxide film. The cap film 34 is a film with a dielectric constant higher than that of silicon oxide, and is, for example, a silicon nitride film. The cap film 34 is provided to contact the electrode layer WL, so that back tunnel electrons injected from the electrode layer WL at erasing can be suppressed. That is, when the stacked body film of the silicon oxide film and the silicon nitride film is used as the block insulating film 35, the charge blocking property can be enhanced.

As shown in FIGS. 1 and 2, a drain side select transistor STD is provided at the upper end part of one of the pair of columnar parts CL in the U-shaped memory string MS, and a source side select transistor STS is provided at the upper end part of the other.

The memory cell, the drain side select transistor STD, and the source side select transistor STS are vertical transistors in which current flows in the stacking direction (Z-direction) of the stacked body.

The drain side select gate SGD functions as a gate electrode (control gate) of the drain side select transistor STD. An insulating film 51 (FIG. 2) functioning as a gate insulating film of the drain side select transistor STD is provided between the drain side select gate SGD and the channel body 20. The channel body 20 of the drain side select transistor STD is connected to the bit line BL at a position above the drain side select gate SGD.

The source side select gate SGS functions as a gate electrode (control gate) of the source side select transistor STS. An insulating film 52 (FIG. 2) functioning as a gate insulating film of the source side select transistor STS is provided between the source side select gate SGS and the channel body 20. The channel body 20 of the source side select transistor STS is connected to the source line SL at a position above the source side select gate SGS.

A back gate transistor BGT is provided in the connecting part JP of the memory string MS. The back gate BG functions as a gate electrode (control gate) of the back gate transistor BGT. The memory film 30 provided in the back gate BG functions as a gate insulating film of the back gate transistor BGT.

The plural memory cells in which the electrode layers WL of the respective layers are control gates are provided between the drain side select transistor STD and the back gate transistor BGT. Similarly, the plural memory cells in which the electrode layers WL of the respective layers are control gates are provided between the back gate transistor BGT and the source side select transistor STS.

The plural memory cells, the drain side select transistor STD, the back gate transistor BGT and the source side select transistor STS are connected in series through the channel body 20, and constitute one U-shaped memory string MS. A plurality of the memory strings MS are arranged in the X-direction and the Y-direction, so that the plural memory cells are three-dimensionally provided in the X-direction, the Y-direction and the Z-direction.

Figure 9:
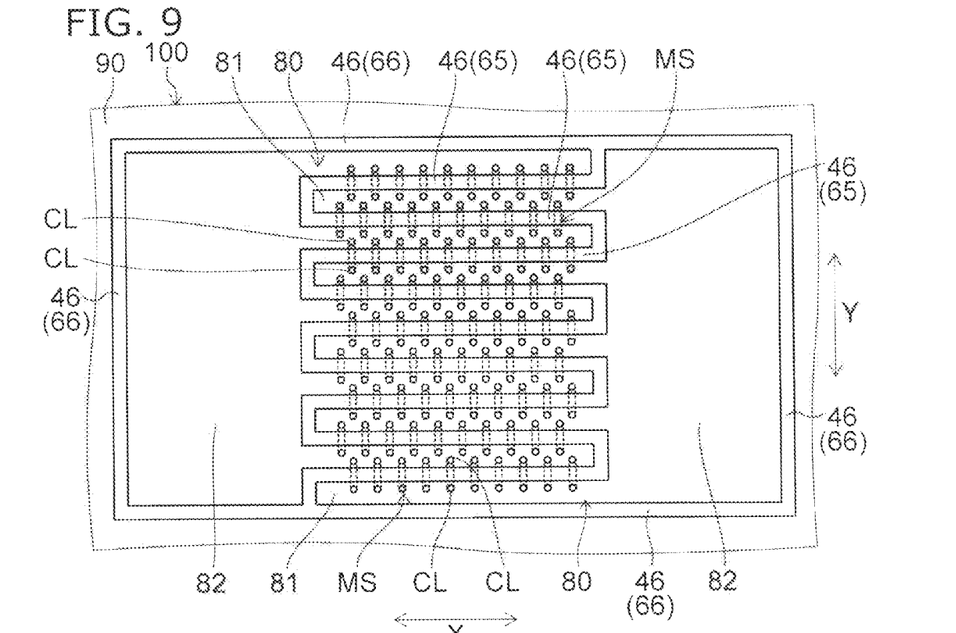
FIG. 9 is a schematic plan view of the memory cell array of the embodiment.

FIG. 9 is a schematic plan view of the memory cell array of the embodiment.

A part of a stacked body 100 including the electrode layers WL and the insulating layers 40 is processed into a comb-shaped pattern 80 including plural line parts 81 extending in the X-direction. The memory cell array is isolated from another region in the stacked body 100 and another memory cell array by the insulating isolation films 46 formed in second slits 66 described later.

The two comb-shaped patterns 80 are combined and one memory cell array is formed in the region surrounded by a closed pattern of the insulating isolation films 46 (the second slits 66).

The line parts 81 of one of the comb-shaped patterns 80 are respectively positioned between the plural line parts 81 of the other of the comb-shaped patterns 80. The plural line parts 81 of the two comb-shaped patterns 80 are arranged in the Y-direction while the insulating isolation film 46 formed in a first slit 65 is sandwiched between the line parts.

Each of the comb-shaped patterns 80 includes an end part 82. The end part 82 is provided with a configuration for connecting the electrode layers WL of the respective layers to a word wiring layer, not illustrated. For example, the plural electrode layers WL are processed stepwise in the end part 82. Each of the stepwise electrode layers WL is connected to the word wiring layer through a plug electrode.

The plural line parts 81 of one of the comb-shaped patterns 80 extend in the X-direction from their own end part 82 to the end part 82 of the other of the comb-shaped patterns 80. The plural line parts 81 of the other of the comb-shaped patterns 80 extend in the X-direction from their own end part 82 to the end part 82 of the one of the comb-shaped patterns 80. Accordingly, a memory cell array region including the plural line parts 81 is formed between the end part 82 and the end part 82.

The columnar part CL of the memory string MS is formed in the line part 81. The plural columnar parts CL are disposed in the memory cell array region. The insulating isolation film 46 (first slit 65) intervenes between the pair of columnar parts CL forming one memory string MS in the Y-direction.

Accordingly, the control gate (electrode layer WL) of the memory cell formed in one of the pair of columnar parts CL positioned at both sides of the insulating isolation film 46 (first slit 65) and the control gate (electrode layer WL) of the memory cell formed in the other can be independently controlled by the different comb-shaped patterns 80.

FIG. 9 shows an example in which the plural columnar parts CL are disposed in, for example, zigzag shapes. However, the plural columnar parts CL may be aligned and disposed in the X-direction and the Y-direction.

Next, a manufacturing method of the semiconductor memory device of the embodiment will be described with reference to FIGS. 4 to 8, 10 and 11A and 11B.

Figure 4:
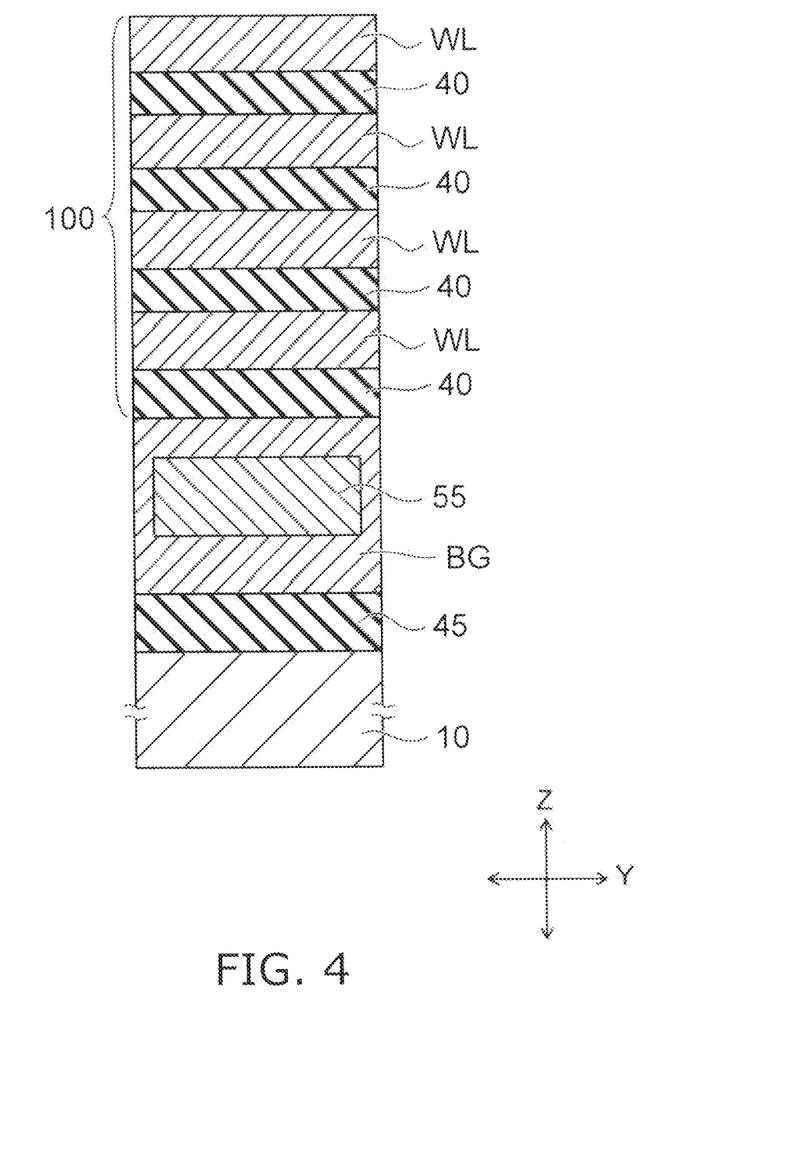
FIG. 4 to FIG. 8 are schematic sectional views showing a method for manufacturing the semiconductor memory device of the embodiment.

As shown in FIG. 4, the back gate BG is formed on the substrate 10 through the insulating layer 45. A concave part is formed in the back gate BG, and a sacrifice film 55 is embedded in the concave part. The sacrifice film 55 is, for example, a silicon nitride film.

The electrode layer WL as a first layer and the insulating layer 40 as a second layer are alternately stacked on the back gate BG. The insulating layer 40 and the electrode layer WL are formed by, for example, a chemical vapor deposition (CVD) method. The process of alternately stacking the electrode layer WL and the insulating layer 40 is repeated plural times.

Figure 5:
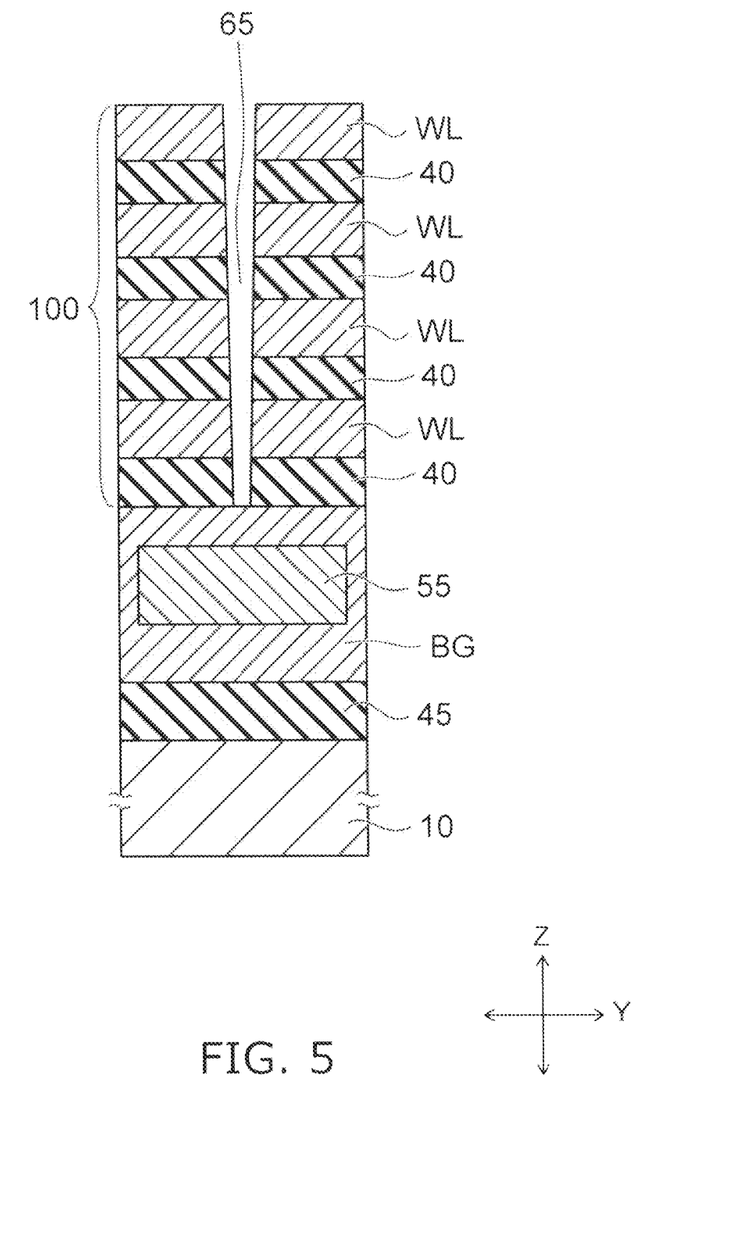

After the stacked body 100 including the electrode layers WL and the insulating layers 40 is formed, as shown in FIG. 5, the first slit 65 is formed in the stacked body 100, so that the stacked body 100 is divided in the Y-direction.

Figure 10:
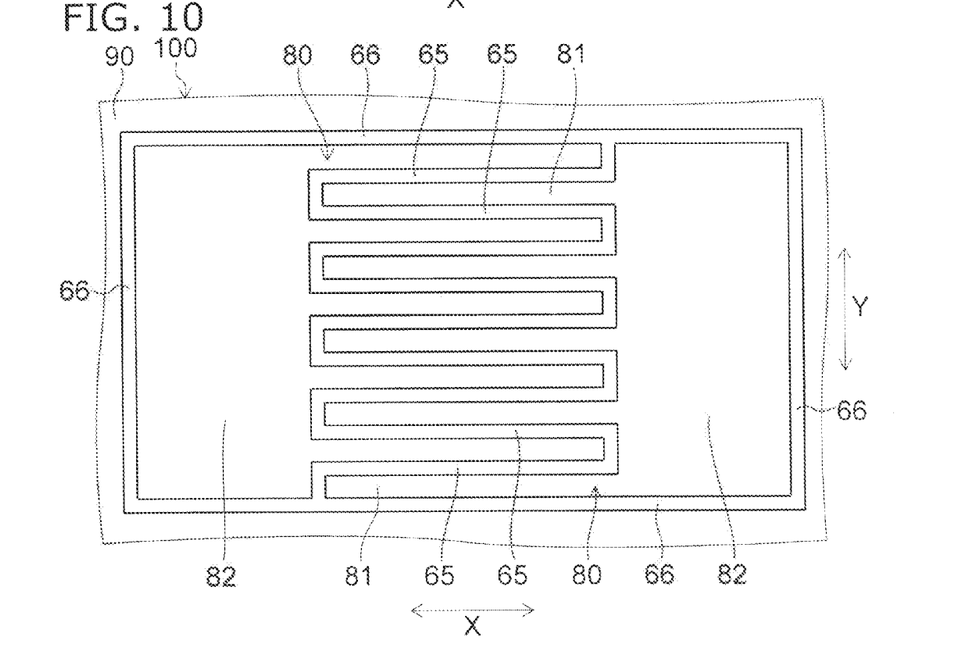
FIG. 10 is a schematic plan view showing a method for manufacturing the semiconductor memory device of the embodiment.

The pair of comb-shaped patterns 80 shown in FIG. 10 are formed in a part of the stacked body 100 by the first slits 65. The plural line parts 81 which extend in the X-direction and are isolated and arranged in the Y-direction are formed by the first slits 65.

Incidentally, at this time, the second slits 66 surrounding the pair of comb-shaped patterns 80 with the closed pattern are also formed simultaneously with the first slits 65.

Figure 11A:
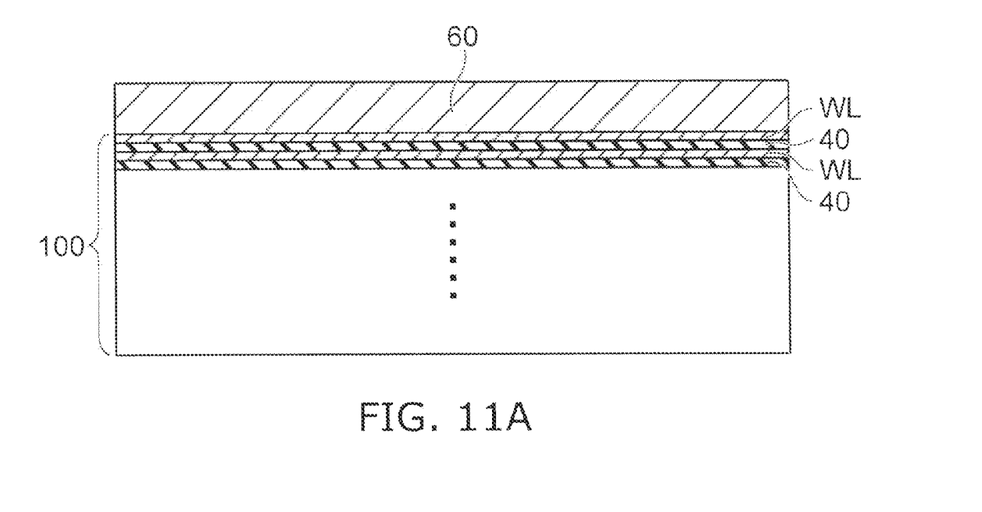
Figure 11B:
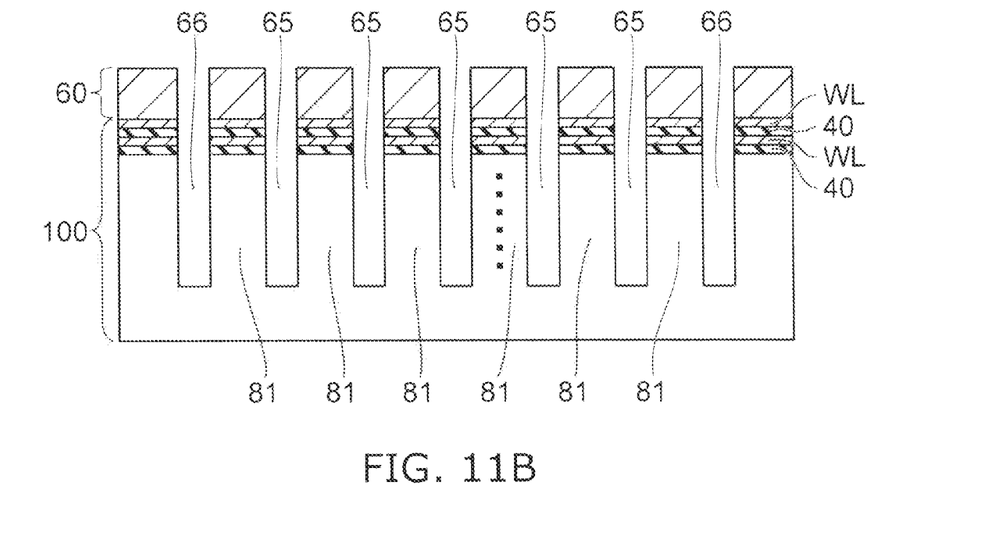

After the stacked body 100 is formed, a mask layer 60 is formed on the stacked body 100 as shown in FIG. 11A. The mask layer 60 is patterned by lithography and RIE (Reactive Ion Etching), and as shown in FIG. 11B, the first slits 65 and the second slits 66 are simultaneously formed by dry etching (RIE) using the patterned mask layer 60 as a mask.

The mask layer 60 is, for example, a carbon layer having conductivity. Any material may be used as long as the material has an etching selection ratio to both oxide silicon as the material of the insulating layer 40 of the etching object and silicon as the material of the electrode layer WL. In addition to carbon, for example, a material including metal may be used for the mask layer 60.

In view of productivity, the mask layer (carbon layer) 60 is formed by, for example, a CVD (Chemical Vapor Deposition) method. In order to enhance the etching selection ratio to the stacked body (oxide silicon and silicon), the carbon concentration is desirably raised by film growth at 650° C. or higher. Accordingly, the mask layer (carbon layer) 60 has conductivity.

Figure 14A:
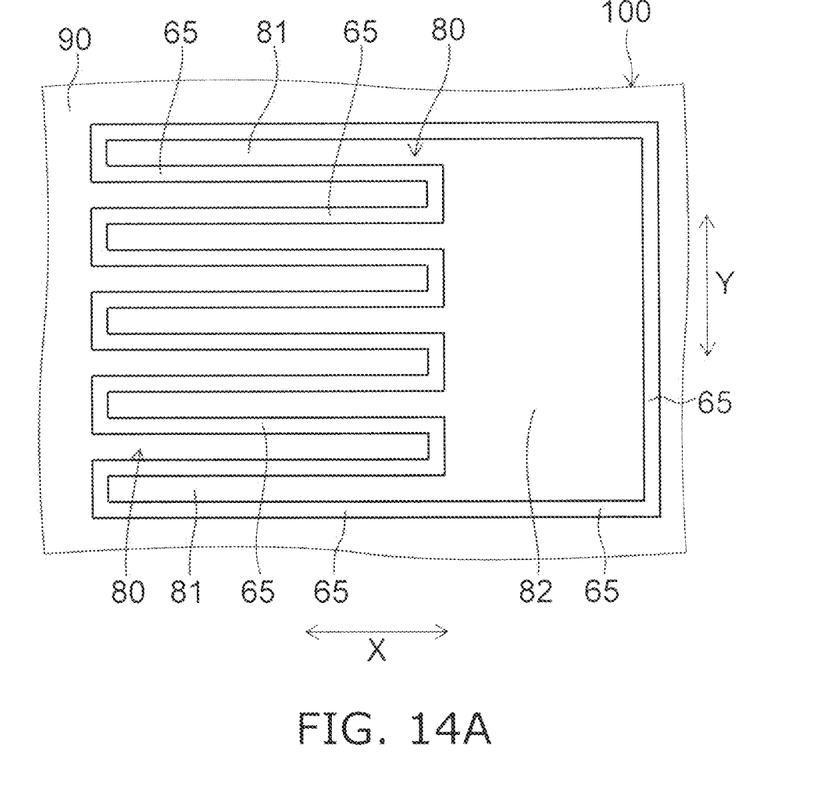
FIGS. 14A and 14B are schematic views showing a method for manufacturing a semiconductor memory device of a reference example.

Here, FIG. 14A shows a layout of the comb-shaped pattern 80 of a reference example. In the example, one of the comb-shaped patterns 80 is isolated in an island shape from another region 90 of the stacked body 100 by the first slits 65, while the other of the comb-shaped patterns 80 is connected to the another region 90.

The potential of the island-shaped comb-shaped pattern 80 isolated from the another region 90 by the first slits 65 is floating. The region 90 outside the island-shaped comb-shaped pattern 80 is connected to a wafer, and the potential of the outside region 90 is an average potential in the wafer plane. That is, since the mask layer 60 of the conductive carbon is used at the RIE, the region 90 outside the island-shaped comb-shaped pattern 80 has the uniform potential over the whole wafer.

Figure 14B:
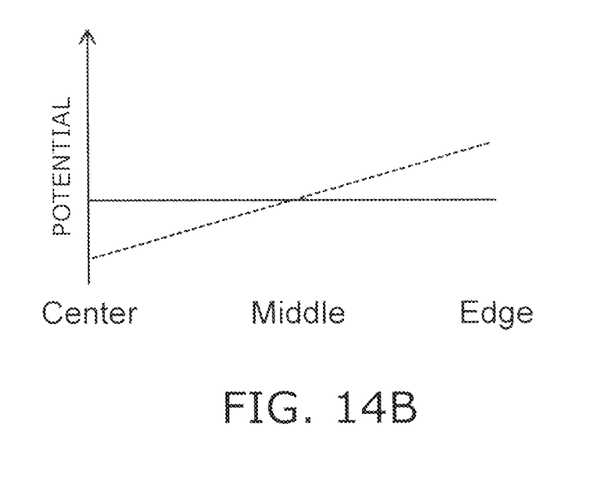

In FIG. 14B, a solid line represents the average potential in the wafer plane, and a broken line represents the potential of the island-shaped comb-shaped pattern 80.

The potential of the island-shaped comb-shaped pattern 80 not connected to the wafer is locally irregular because of the influence of plasma density at the RIE. For example, as shown in FIG. 14B, there is a tendency that the potential of the island-shaped comb-shaped pattern 80 at the center of the wafer is relatively lower than that at the edge side.

Figure 15:
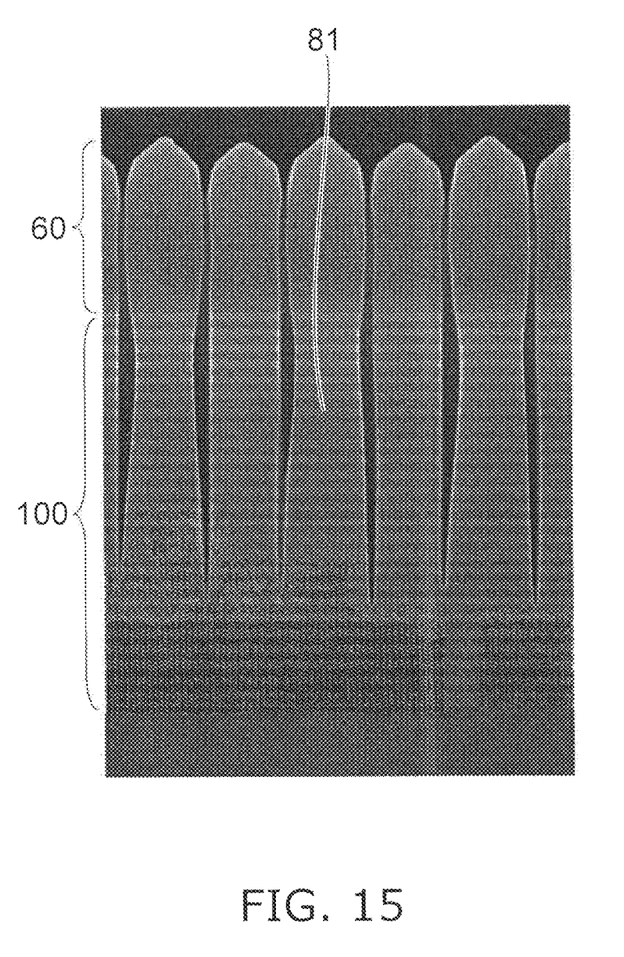
FIG. 15 is a microscopic image showing a method for manufacturing the semiconductor memory device of the reference example.

Accordingly, in FIG. 14A, a potential difference occurs between the adjacent line parts 81 in the Y-direction across the first slit 65, and an incident ion is bent between the adjacent line parts 81 during the RIE. Thus, side etching is apt to proceed only in one line part 81 of the adjacent line parts 81. By this, as shown in a microscopic image of FIG. 15, the width of the line part 81 can become locally narrow. This may cause a short-circuiting defect between the adjacent memory holes.

According to the embodiment, as shown in FIG. 10 and FIG. 11B, at the RIE of forming the first slits 65 for forming the plural line parts 81, the second slits 66 surrounding the pair of comb-shaped patterns 80 with the closed pattern are also formed simultaneously.

Accordingly, all the line parts 81 arranged in the Y-direction are electrically isolated from the wafer and have floating potential, and the line parts 81 are not influenced by the average potential in the wafer plane. Thus, the potential difference between the adjacent line parts 81 in the Y-direction can be made small as compared with that in the reference example, and the phenomenon in which the side etching proceeds only in the one line part 81 of the adjacent line parts 81 can be suppressed As a result, the line parts 81 can be processed to have uniform width in the stacking direction, the yield can be improved, and the reliability of the device can be enhanced.

Figure 6:
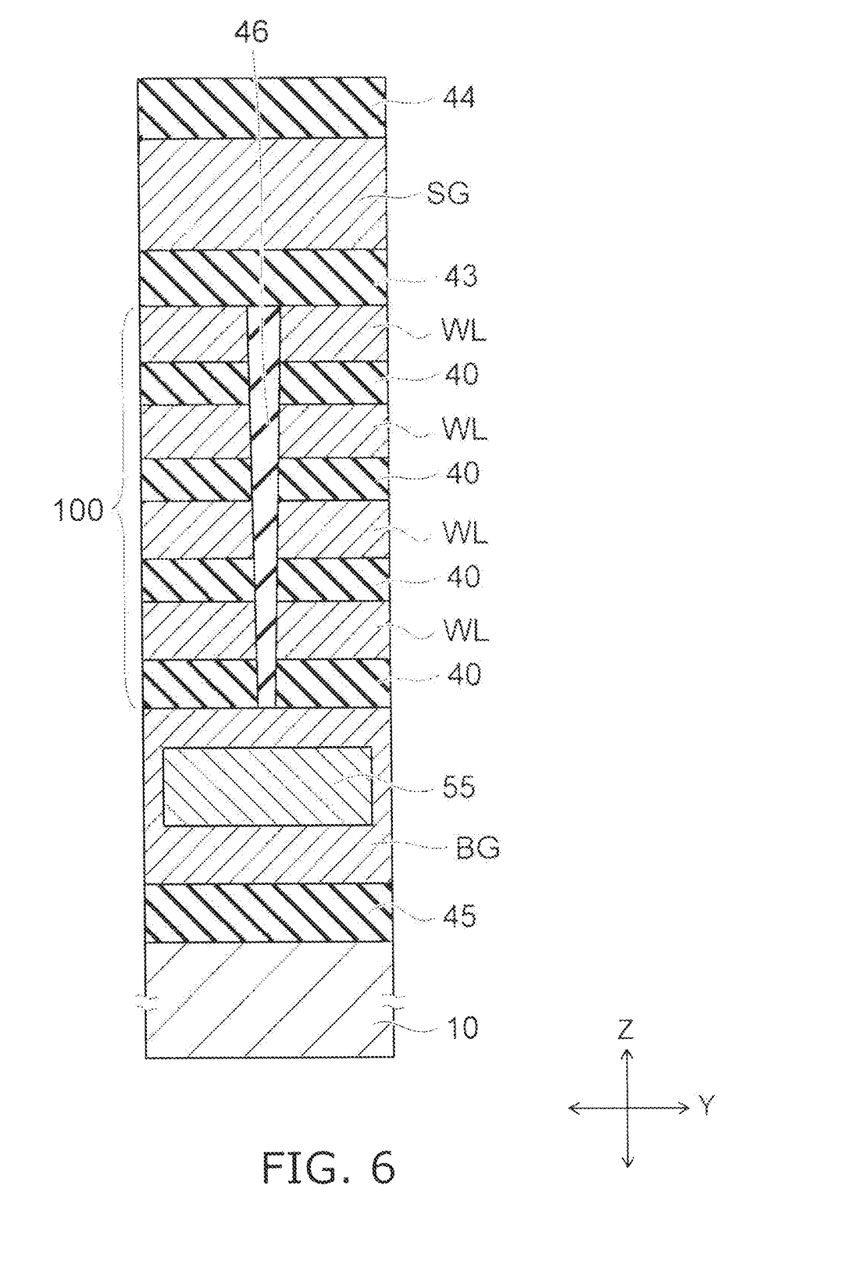

After the first slits 65 and the second slits 66 are formed, as shown in FIGS. 6 and 9, the insulating isolation films 46 are embedded in the first slits 65 and the second slits 66. The insulating isolation film 46 is, for example, a silicon nitride film. The insulating isolation films 46 are simultaneously embedded in the first slits 65 and the second slits 66.

Thereafter, as shown in FIG. 6, the insulating layer 43 is formed on the uppermost electrode layer WL. Further, an upper select gate SG which becomes the drain side select gate SGD or the source side select gate SGS is formed on the insulating layer 43. Further, the insulating layer 44 is formed on the upper select gate SG.

Figure 7:
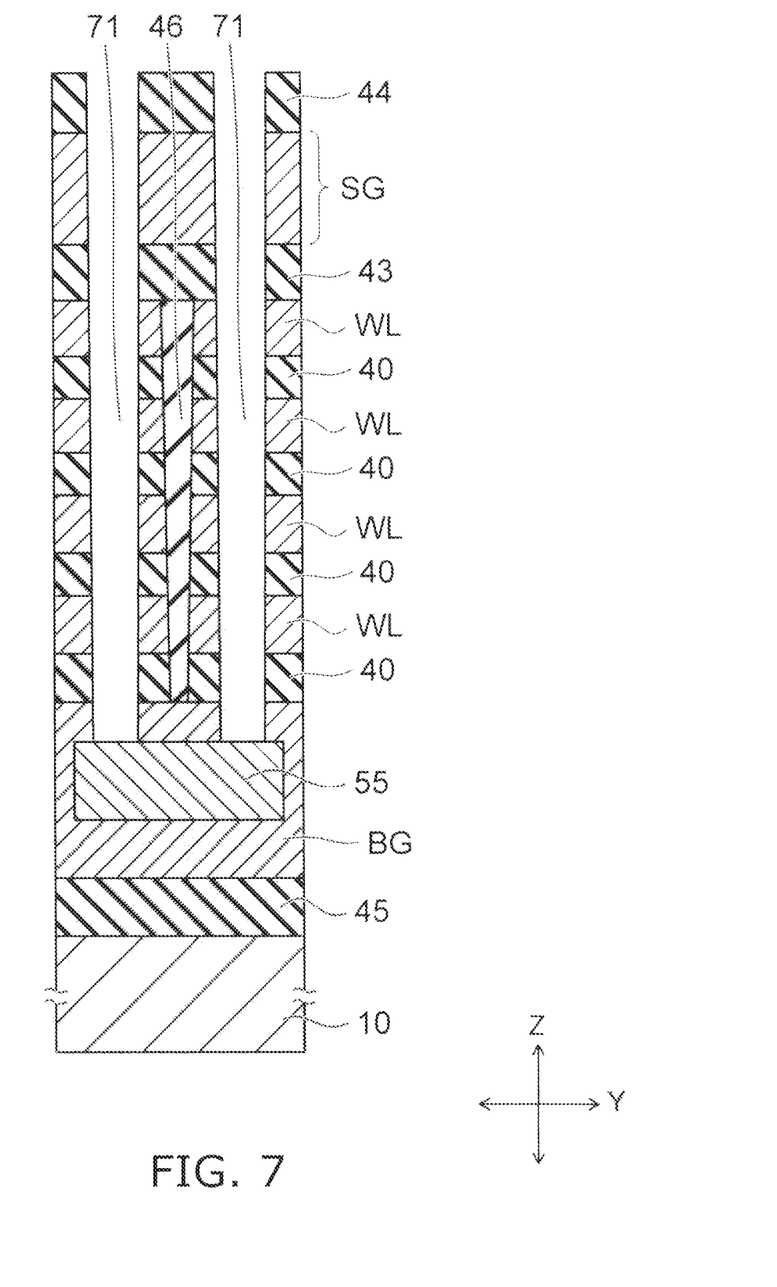

Next, as shown in FIG. 7, plural holes 71 are formed in the stacked body. The holes 71 are formed by, for example, the RIE method using a not-shown mask.

The lower end parts of the holes 71 reach the sacrifice film 55, and the sacrifice film 55 is exposed at the bottoms of the holes 71. A pair of the holes 71 are formed on one sacrifice film 55.

After the holes 71 are formed, the sacrifice film 55 is removed by etching through the holes 71. The sacrifice film 55 is etched by, for example, wet etching.

Figure 8:
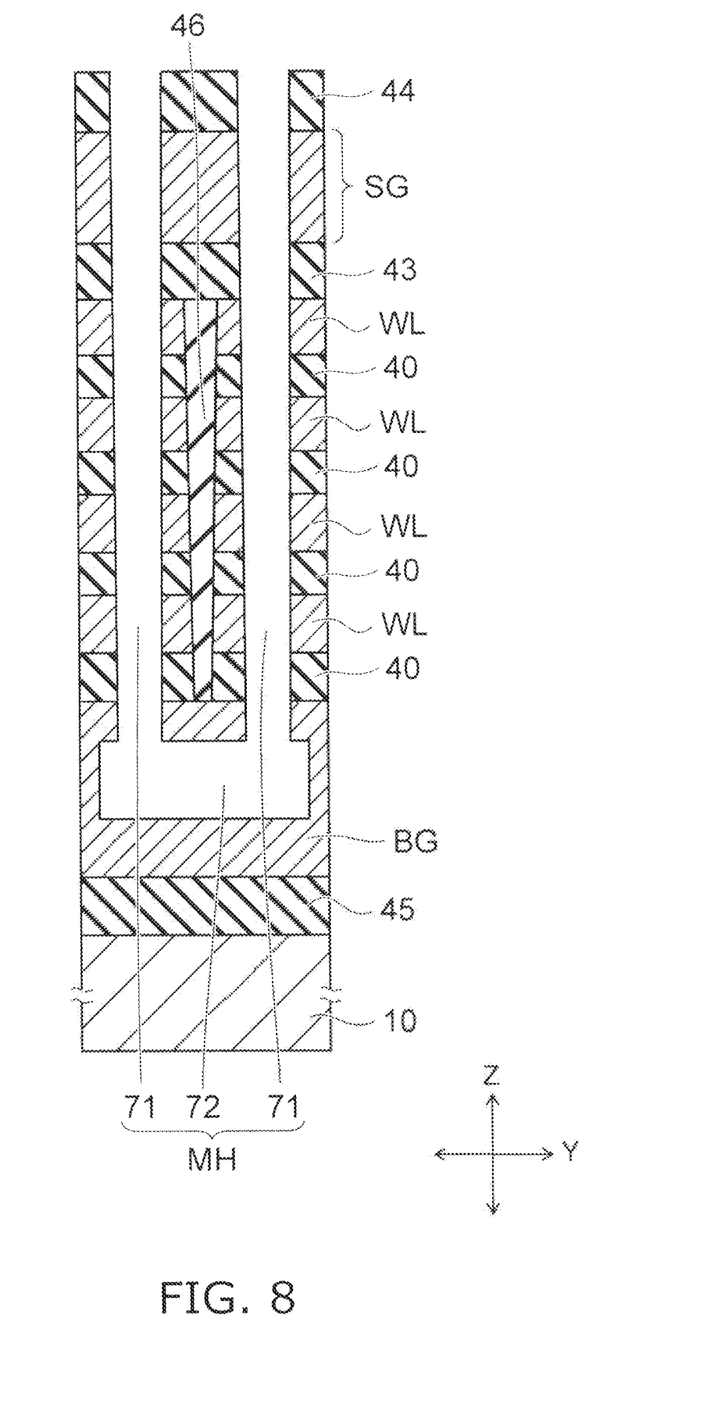

As shown in FIG. 8, a concave part 72 formed in the back gate BG appears by the removal of the sacrifice film 55. The pair of holes 71 are connected to one concave part 72. That is, each of the lower end parts of the pair of holes 71 is connected to the one common concave part 72, and one U-shaped memory hole MH is formed.

After the memory hole MH is formed, the respective films shown in FIG. 3 are sequentially formed on the inner wall of the memory hole MH.

After the memory film 30, the channel body 20 and the core insulating film 50 are formed in the memory hole MH, the upper select gate SG between the pair of columnar parts CL is divided in the Y-direction by the insulating isolation film 47 as shown in FIG. 2.

Thereafter, the source lines SL, the bit lines BL and the like shown in FIG. 1 are formed on the insulating layer 44.

For example, in a CVD method of a carbon layer at 550° C. or lower, the carbon layer has insulation properties. The mask layer 60 of such insulation carbon may be used as the mask for slit processing. For example, when a silicon oxide layer is used as the insulating layer 40, and a metal layer is used as the electrode layer WL, the insulation carbon can have a high etching selection ratio to both of silicon oxide and metal.

Figure 12A:
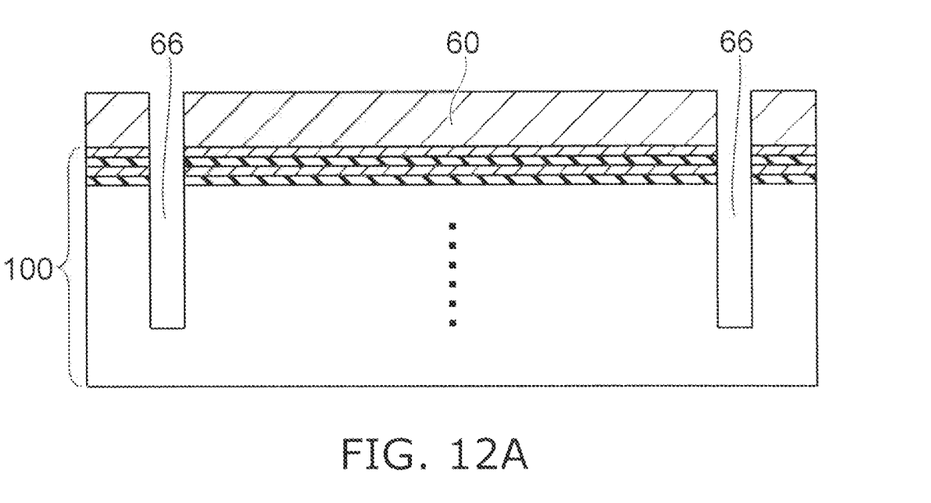

In this case, as shown in FIG. 12A, the second slits 66 of the closed pattern are formed by the RIE method prior to the first slits 65. At this time, the region inside the second slits 66 is covered with the mask layer 60.

Figure 12B:
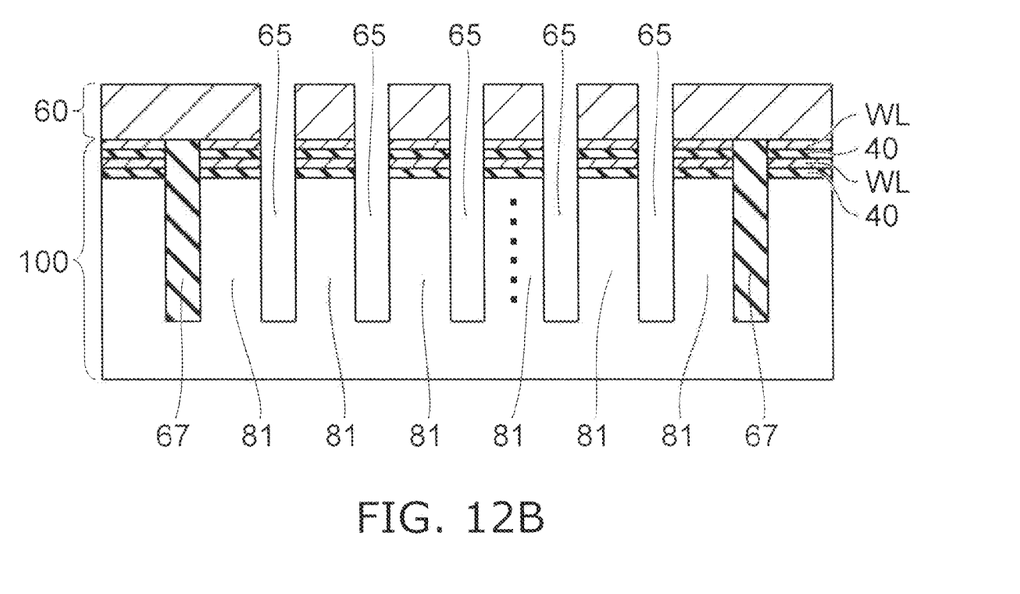
Figure 13:
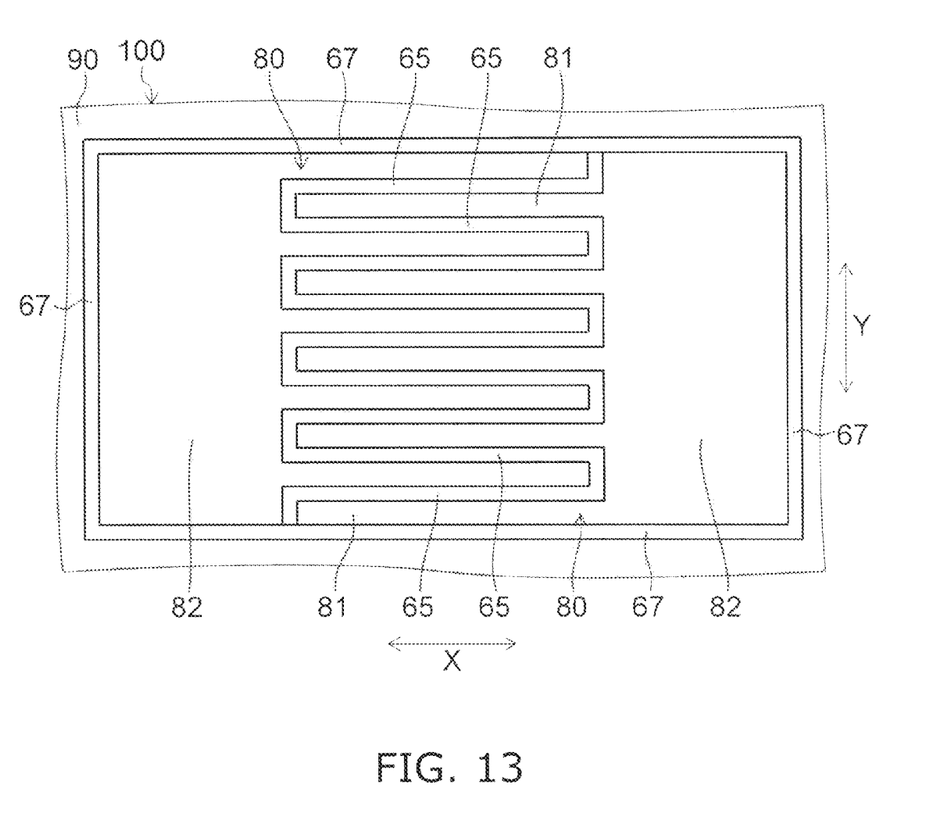
FIG. 13 is a schematic plan view showing a method for manufacturing the semiconductor memory device of the embodiment.

Then, as shown in FIG. 12B and FIG. 13, after insulating isolation films 67 are embedded in the second slits 66, the mask layer 60 of insulation carbon is again formed on the stacked body 100. After the mask layer 60 is patterned, the first slits 65 are formed by the RIE method in the region surrounded by the insulating isolation films 67 (second slits 66) of the closed pattern. At this time, the mask layer 60 covers the insulating isolation film 67.

At the RIE of forming the first slits 65, all the line parts 81 arranged in the Y-direction are electrically isolated from the wafer by the insulating isolation films 67 and have floating potential, and the line parts 81 are not influenced by the average potential in the wafer plane. Thus, the potential difference between the adjacent line parts 81 in the Y-direction can be made small as compared with that in the reference example, and the phenomenon in which side etching proceeds only in one line part 81 of the adjacent line parts 81 can be suppressed.

Incidentally, although the upper surface of the line part 81 adjacent to the insulating isolation film 67 and the upper surface of the wafer side region 90 are connected through the mask layer 60, since the mask layer 60 is insulative, the line part 81 adjacent to the insulating isolation film 67 is not influenced by the average potential in the wafer plane.

Silicon layers with different impurity concentrations may be alternately stacked as the first layer and the second layer. In this case, a conductive carbon layer having a high carbon ratio or a metal layer can be used as the mask layer of the RIE at slit formation.

Then, an etching rate difference due to the difference in the impurity concentration is used, and the stacked body in which the electrode layer and the insulating layer are alternately stacked can be formed by removing one of the silicon layers (for example, the silicon layer with low impurity concentration) by etching through the slit or the memory hole, and by embedding the insulating layer in the space where the silicon layer is removed.

Alternatively, a silicon nitride film and a silicon oxide film may be alternately stacked as the first layer and the second layer. In this case, a conductive carbon layer having a high carbon ratio or a metal layer can be used as the mask layer of the RIE at slit formation.

Then, the stacked body in which the electrode layer and the insulating layer are alternately stacked can be formed by removing, for example, the silicon nitride film by etching through the slit or the memory hole, and by embedding the electrode layer in the space where the silicon nitride film is removed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor memory device, comprising:
   forming a stacked body including a plurality of first layers and a plurality of second layers by alternately stacking the first layers and the second layers on a substrate;
   forming a first slit and a second slit simultaneously by dry-etching the stacked body using a mask layer, the first slit causing a part of the stacked body to have a comb-shaped pattern including a plurality of line parts isolated in a first direction and extending in a second direction intersecting the first direction, the second slit surrounding the comb-shaped pattern with a closed pattern;
   forming a hole in the line parts of the stacked body; and
   forming a charge storage film and a semiconductor body in the hole.

2. The method according to claim 1, wherein the mask layer has conductivity.

3. The method according to claim 2, wherein the mask layer is a carbon layer.

4. The method according to claim 3, wherein the carbon layer is formed by a chemical vapor deposition (CVD) method at a temperature of 650° C. or higher.

5. The method according to claim 3, wherein the first layer is a silicon layer, and the second layer is a silicon oxide layer.

6. The method according to claim 3, wherein the first layer is a silicon nitride layer, and the second layer is a silicon oxide layer.

7. The method according to claim 2, wherein the mask layer is a metal layer.

8. The method according to claim 7, wherein the first layer is a silicon layer, and the second layer is a silicon oxide layer.

9. The method according to claim 7, wherein the first layer is a silicon nitride layer, and the second layer is a silicon oxide layer.

10. The method according to claim 1, wherein a potential of the comb-shaped pattern surrounded by the second slit is floating.

11. The method according to claim 1, further comprising forming an insulating film simultaneously in the first slit and the second slit.

12. A manufacturing method of a semiconductor memory device, comprising:
    forming a stacked body including a plurality of first layers and a plurality of second layers by alternately stacking the first layers and the second layers on a substrate;
    forming a second slit which passes through the stacked body and surrounds a part of the stacked body with a closed pattern;
    forming an insulating film in the second slit;
    forming a first slit by dry-etching the stacked body using an insulative mask layer after the insulating film is formed in the second slit, the first slit causing the part of the stacked body surrounded by the second slit to have a comb-shaped pattern including a plurality of line parts isolated in a first direction and extending in a second direction intersecting the first direction;
    forming a hole in the line parts of the stacked body; and
    forming a charge storage film and a semiconductor body in the hole.

13. The method according to claim 12, wherein the mask layer is a carbon layer.

14. The method according to claim 13, wherein the carbon layer is formed by a chemical vapor deposition (CVD) method at a temperature of 550° C. or lower.

15. The method according to claim 12, wherein the first layer is a metal layer, and the second layer is a silicon oxide layer.

16. The method according to claim 12, wherein a potential of the comb-shaped pattern surrounded by the second slit is floating.

* * * * *